(12) United States Patent
Avery et al.

(10) Patent No.: US 6,181,008 B1
(45) Date of Patent: Jan. 30, 2001

(54) INTEGRATED CIRCUIT POWER SUPPLY

(75) Inventors: Leslie Ronald Avery, Flemington;
Robert Amantea, Manalapan;
Lawrence Alan Goodman, Plainsboro,
all of NJ (US)

(73) Assignee: Sarnoff Corporation, Princeton, NJ (US)

( * ) Notice: Under 35 U.S.C. 154(b), the term of this patent shall be extended for 0 days.

(21) Appl. No.: 09/327,797

(22) Filed: Jun. 8, 1999

Related U.S. Application Data

(60) Provisional application No. 60/108,077, filed on Nov. 12, 1998, and provisional application No. 60/117,908, filed on Jan. 29, 1999.

(51) Int. Cl.[7] ........................................ H01L 23/34
(52) U.S. Cl. ................................. 257/723; 257/777
(58) Field of Search .......................... 257/700, 723, 257/777, 778; H01L 23/34

(56) References Cited

U.S. PATENT DOCUMENTS

| | | | |
|---|---|---|---|
| 4,742,385 | * 5/1988 | Kohmoto | 357/74 |
| 5,444,296 | 8/1995 | Kaul et al. | 257/686 |
| 5,608,261 | 3/1997 | Bhattacharyya et al. | 257/700 |
| 5,790,384 | 8/1998 | Ahmad et al. | 361/760 |
| 5,798,567 | * 8/1998 | Kelly et al. | 257/723 |

* cited by examiner

Primary Examiner—Don Wong
Assistant Examiner—Shih-Chao Chen
(74) Attorney, Agent, or Firm—William J. Burke

(57) ABSTRACT

An integrated circuit system includes a substrate of an electrical insulating material having a surface. Mounted on the surface of the substrate is an IC, a semiconductor piece having therein a circuit, such as a microprocessor, having a plurality of functional blocks. Also mounted on the substrate are a plurality of power supply chips. Each of the power supply chips is connected through conductors and vias in the substrate to a separate functional block on the IC semiconductor piece. Each of the power supply chips forms part of a circuit, such as a DC-DC converter, which is capable of reducing a voltage supplied thereto to a lower voltage suitable for the particular functional block to which the particular power supply chip is connected. Thus, a single relatively large voltage fed to the power supply chips through conductors on the substrate is reduced by each power supply chip to a lower voltage suitable for the particular functional block of the IC semiconductor piece.

19 Claims, 2 Drawing Sheets

INTEGRATED CIRCUIT POWER SUPPLY

This application claims the benefit of U.S. Provisional Application Serial No. 60/108,077 filed Nov. 12, 1998, and U.S. Provisional Application Serial No. 60/117,908 filed Jan. 29, 1999.

FIELD OF THE INVENTION

The present invention relates to an integrated circuit (IC) power supply, and, more particularly, to a semiconductor integrated circuit system which includes a plurality of power supplies contained within the system which are electrically connected to different parts of the circuit within the system.

BACKGROUND OF THE INVENTION

Semiconductor integrated circuit devices are getting larger because they incorporate a number of various types of circuits on a single chip. In order to accommodate all of the various circuits on a single chip, the feature size of the various elements forming the circuit are becoming smaller. Thus, the feature size of these integrated circuits are scaling into the deep submicron range. For such sizes, the power supply voltages are reaching towards the sub-one volt level, and clock speeds are scheduled to exceed one Gigahertz. For very large integrated circuits, such as a microprocessor, the power supply current is expected to be many tens of amperes. To provide this type of power from off chip is very difficult and requires a large number of power and ground pads (ports) around the chip. Also, distributing the current on chip from the large number of power and ground pads requires many relatively wide and thick metal conductors to prevent the significant high resistance losses which could ultimately limit the device performance.

SUMMARY OF THE INVENTION

An integrated circuit device includes a substrate of an insulating material having a surface. An IC semiconductor chip is mounted on the surface of the substrate. The IC chip contains an electrical circuit having a plurality of functional blocks. A plurality of power supply chips are mounted on the substrate with the power supply chips being electrically connected to separate functional blocks of the IC chip. Each of the power supply chips is capable of reducing an input voltage to a lower voltage as required by the functional block to which the power supply chip is connected.

DETAILED DESCRIPTION OF PREFERRED EMBODIMENT

Figure 1:
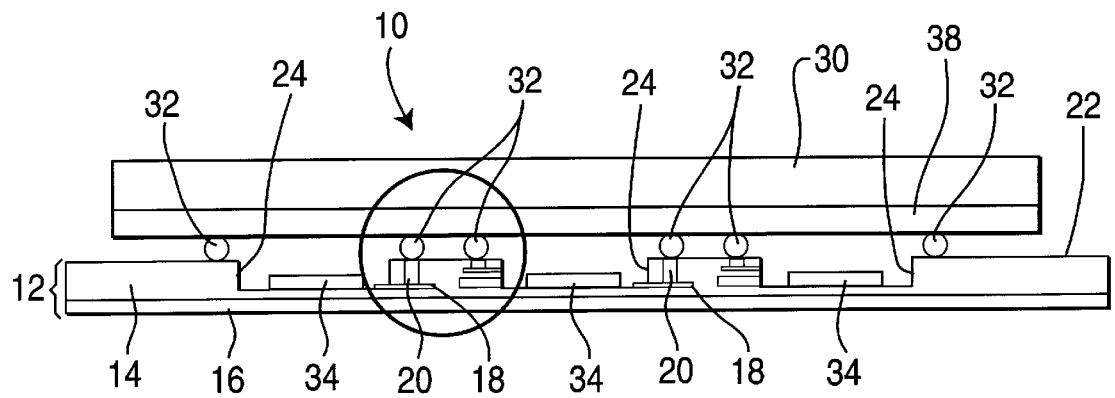
FIG. 1 is a schematic sectional view of a form of the integrated circuit system of the present invention.

Referring initially to FIG. 1, the integrated circuit system of the present invention is generally designated as 10. Integrated circuit system 10 comprises a substrate 12 of a body 14 of an insulating material, such as a ceramic, on a base 16 of a conductive material, such as a metal. The insulating body 14 can be formed of a plurality of layers of the insulating material which are bonded together, the body 14 being bonded to the metal base 16. The body 14 may also include metal circuitry 18 screen printed onto the surface of each of the insulating layers 14, Conductive vias 20 formed in the layers 14 are filled with conductive material to connect the various circuits 18 on the layers 14. These vias 20 extend through the body 14, connecting the various conductors 18 to the top surface 22 of the body 14.

The above substrates are known as multilayer ceramic printed circuit boards. They are made from low firing temperature glasses that crystallize below about 950° C. Such glasses include those of the cordierite-forsterite type made from oxides of magnesium, aluminum and silicon. A green tape composition is made from finely divided glass particles, optionally including other inorganic filler particles, mixed with an organic vehicle to form a slip or slurry. The slip is cast in the form of a tape, called green tape. The tape is dried and then fired to form a ceramic layer.

Conductive circuits can be applied to the surface of the green tape by screen printing a conductor ink, made of conductive particles, such as of copper, silver or gold, glass particles, generally of the same glass as that used to make the green tape, and an organic vehicle. Vias are formed in the green tape which are filled with a conductive via ink, generally also made of a glass which can be the same as that used to make the green tape or a higher Tg glass, a conductive powder and an organic vehicle. The conductive vias electrically connect the screen printed circuits. A plurality of the screen printed green tapes are then aligned, laminated together and fired to remove the organic materials and crystallize the glass.

A recent development has been the addition of a metal support substrate bonded to the bottom of the green tape stack. Such metal supports add mechanical strength to the green tape stack. Further, when a suitable bonding glass is used to bond the green tape stack to the metal support substrate, the metal support prevents shrinkage in the x and y dimensions, so that all of the shrinkage is found in the z, or thickness dimension. This permits closer tolerances in the circuitry and any passive components included within the green tape stack.

The metal support can be made of copper clad molybdenum, or copper clad Kovar® alloy. Kovar® is a registered trademark of Carpenter Technology for an alloy of iron, nickel, cobalt and a minor amount of manganese. The bonding glass can be screen printed onto the metal support substrate, and generally has a coefficient of expansion higher than the metal support substrate and the glass of the green tape. The bonding glass can comprise, in % by weight, about 45–55% of zinc oxide, from 30–40% of boron oxide, from 3–7% of calcium oxide and from 3–7% of alumina, or 20–45% of barium oxide, 5–15% of calcium oxide, 15–22% of zinc oxide, 15–25% of silicon oxide and 15–25% of boron oxide.

Glass compositions compatible with Kovar® include crystallizable $ZnO$—$MgO$—$B_2O_3$ mixtures. These glasses can also include non-crystallizable lead-based glasses or oxide-based fillers.

The green tape stack can be made with punched cavities, into which passive devices can be placed; however, more conveniently, devices such as capacitors, resistors, inductors and the like can be screen printed onto a green tape stack. The manufacture of such passive devices will be further explained below.

Figure 2:
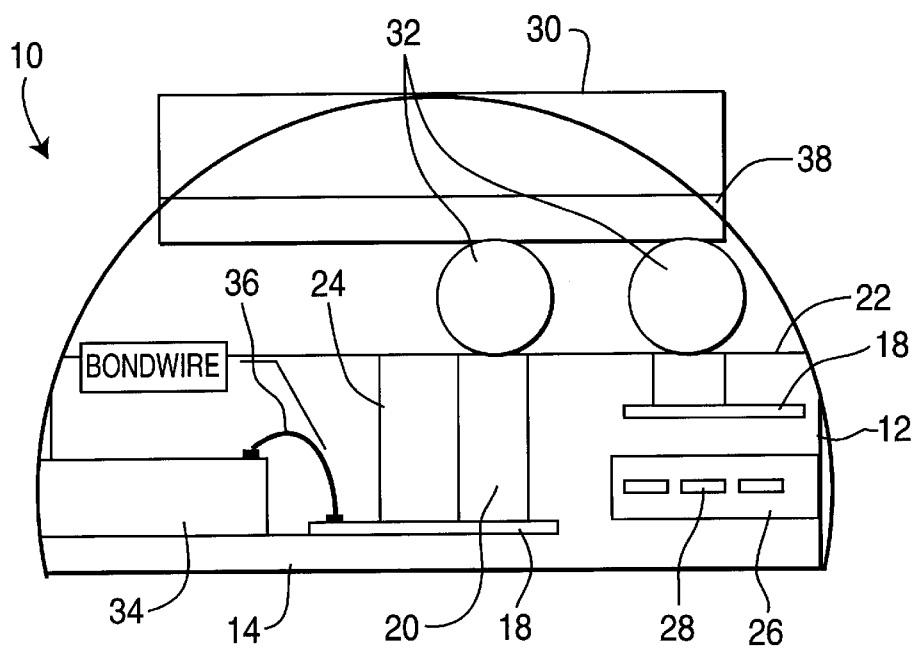
FIG. 2 is an enlarged sectional view of the circled portion of the integrated circuit system shown in FIG. 1.

As shown in FIG. 1, the body 14 has a plurality of spaced recesses 24 formed in its top surface 22. As more clearly shown in FIG. 2, each of the recesses 24 exposes a portion of a conductor 18 at the bottom of the recess 24. Also, as shown in FIG. 2, the body 14 may have areas 26 of a magnetic material having conductors 28 either surrounding (not shown) or embedded therein to form inductors or the like.

Over the top surface 22 of the body 14 is an IC piece 30. The IC piece 30 comprises a semiconductor material 38, such as silicon, having therein transistors, diodes, resistors and capacitors which are connected together to form a desired circuit or a series of circuits, such as a microprocessor and related circuitry. The structure of such IC circuits are well known and will not be described in detail. However, the terminal pads for the various parts of the circuits extend to the surface of the base 16 and terminal bumps 32, of a conductive material such as a metal, are formed on each of the terminal pads. It should be understood that instead of terminal bumps 32, any other well known type of surface mountable terminal may be used at each of the terminal pads. The IC chip 30 is mounted on the substrate 12 with the terminal bumps 32 being seated on the top surface 22 of the body 14. As shown in both FIGS. 1 and 2, each of the terminal bumps 32 is seated directly on the top of a conductive via 20 and is bonded thereto, such as by welding or soldering. Thus, the circuits in the IC piece 30 are electrically connected to the conductors 18 in the body 14 through the terminal bumps 32 and the vias 20. If desired, a conductive terminal area (not shown) may be provided on the top surface 22 of the body 14 around and over each of the vias 20 so as to simplify making the electrical connection of the terminal bumps 32 to the vias 20.

A separate power supply circuit chip 34 is mounted in each of the recesses 24 in the body 14 of the substrate 12. Each of the power supply Circuit chips 34 is an integrated circuit which comprises a chip of a semiconductor material having various circuit elements, such as transistors, diodes, resistors and capacitors therein to form the desired circuit. The circuit for each of the power supply circuit chips 34 is preferably a DC-DC converter to convert the high voltage supplied to the integrated circuit system 10 to a lower voltage suitable for the particular part of the main circuit to which the power supply circuit 34 is connected. As shown in FIG. 2, each of the power supply circuit chips 34 may be electrically connected to its respective portion of the circuit on the IC piece 30 by a wire bond 36. The wire bond 36 extends from the power supply circuit chip 34 to a conductor 18 which is exposed at the bottom of the recess 24. However, if desired, the power supply circuit chip 34 may be electrically connected to the conductors 18 by any other well known type of connection, such as a surface bond. Thus, each of the power supply circuit chips 34 is designed to reduce the larger input voltage to a lower voltage which is required for the particular part of the integrated circuit on the IC chip 30. Thereby, although a single relatively high voltage may be supplied to the system 10, each portion of the integrated circuit is supplied with only the lower voltage which is required for that particular portion of the circuit. In addition, the connections between the IC chip 30 and the power supply circuit chips 34 are made using vias directly connected to that section on the IC piece 30 where power is needed, rather than to pads located on the perimeter of the chip as in a prior art chip. This keeps the power bus widths narrow and the lengths on the IC piece 30 short, with acceptable power bus thickness, while saving space and minimizing resistive current loss and electrical noise. Also, the common signal ground on the IC piece 30 takes minimal current, and can be of minimum width. Alternatively, a differential drive could be used between functional blocks, allowing some difference in the common signal reference bus voltage without affecting signal integrity. In yet another embodiment, the control of the power supply circuit chips 34 can be fabricated on separate chips to the power supply switching devices, or a common control chip can be used to control several output switching devices.

If desired, additional capacitors, inductors, transformers and resistors may be fabricated or mounted on the surface of the IC piece 30 or the power circuit chip 34. Also, such devices can be fabricated within the layers of the insulating body 14 of the substrate 12. Power supply energy storage capacitors may be formed on the surface of the IC piece 30 for maximum performance. In addition, feedback lines may be provided from the IC piece 30 to the power supply circuit chips 34 to provide better regulation.

Figure 3:
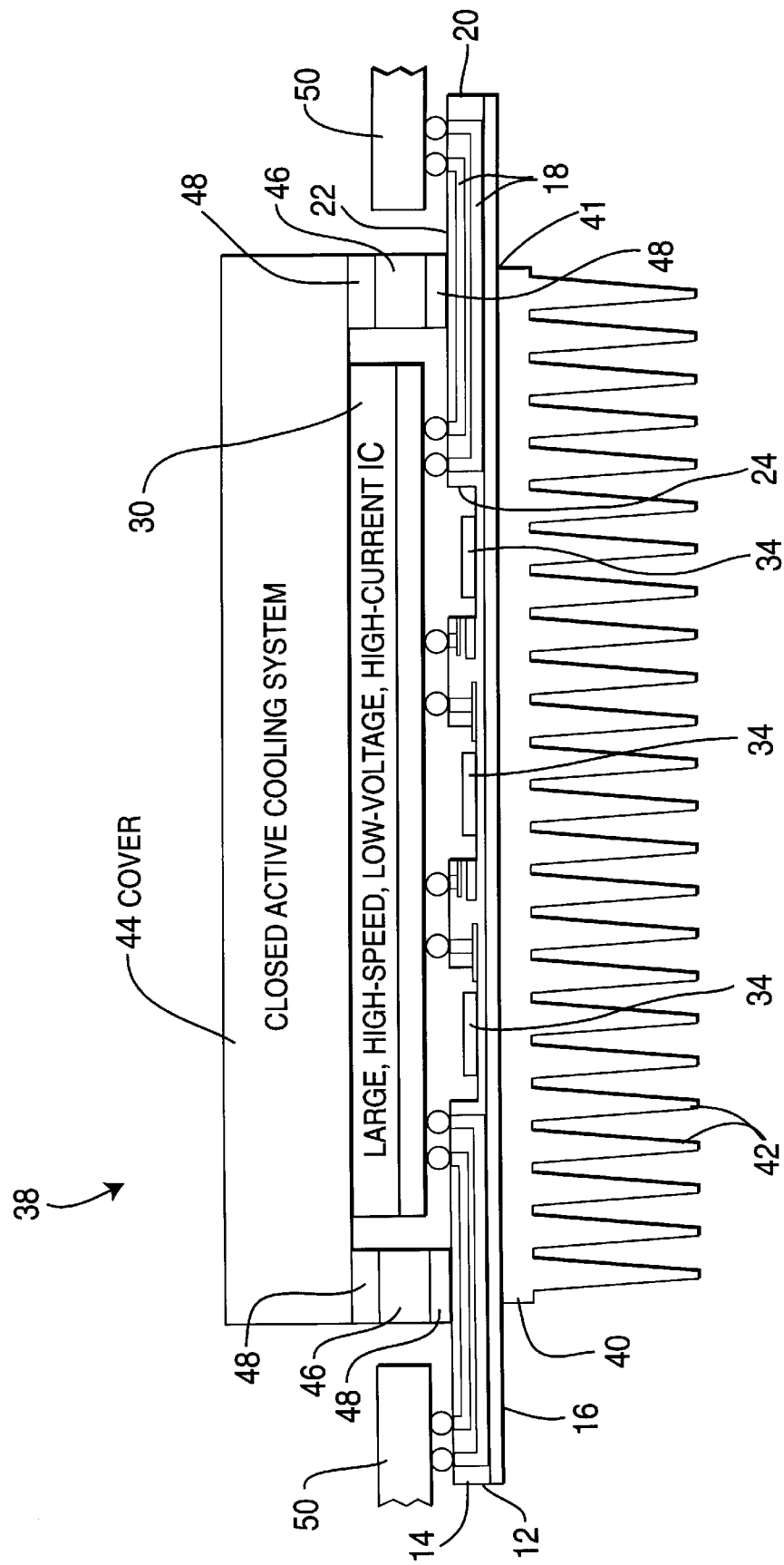
FIG. 3 is a schematic sectional view of a sealed package including the integrated circuit system of the present invention.

Referring to FIG. 3, there is shown a package 38 containing the integrated circuit system 10. In the package 38, the substrate 12 is mounted on a heat dissipation plate 40 of a heat conductive material, such as a metal. The heat dissipation plate 40 has a plurality of heat dissipation fins 42. The substrate 12 is mounted on the heat dissipation plate 40 with the base 16 being seated on the top surface 41 of the plate 40 and secured thereto with a suitable bonding material 48. A cover 44 extends over the integrated circuit system 10 and beyond the outer edges of the integrated circuit system 10. A spacer ring 46 is mounted between the cover 44 and the substrate 12 of the integrated circuit system 10. The spacer ring 46 is secured to both the cover 44 and the body 14 of the integrated circuit system 10. The spacer ring 46 is made of a material having a thermal coefficient of expansion between that of the cover 44 and the body 14 of the integrated circuit system 10 so as to prevent any breaking of the bond between the spacer ring 46 and the cover 44 and the integrated circuit system 10. The cover 44 may be of a material having good heat conduction, or, preferably, may contain a suitable closed active cooling system, such as a flow of a suitable cooling medium. The substrate 12 of the integrated circuit system 10 is larger than the cover 44 so as to extend beyond the periphery of the cover 44. Various conductors 18 in the body 14 of the substrate 12 extend to vias 20 adjacent the edges of the substrate 12. The vias 20 extend to the top surface 22 of the body 14. Input and output terminals 50 extend over the top surface 22 of the body 14 adjacent the edges of the body 14, and are mechanically and electrically connected to the vias 20 by suitable terminal bumps 32. Thus, the integrated circuit system 10 is hermetically sealed in the package 38 and is provided with dual heat dissipation means, the heat dissipation plate 40 and the cover 44. The input and output terminals 50 are electrically connected to the circuit in the IC piece 30 and to the power supply circuit chips 34 through the conductors 18 and the vias 20.

Thus, there is provided by the present invention an integrated circuit system which includes an IC semiconductor piece having thereon a circuit, such as a microprocessor, which includes a plurality of functional blocks, each of which may use a separate and sometimes different operational voltage. Also included are a plurality of power supplies, such as DC-DC converters, each of which is electrically connected to a separate functional block on the IC piece so as to supply the proper power to the particular functional block. The power supplies are preferably mounted on a substrate of an insulating material on which the IC piece is also mounted. Each of the power supplies is electrically connected to its respective functional block on the IC piece through conductors and vias in the substrate to which terminal pads or bumps on the IC piece are connected, Alternatively, the power supply may be connected directly, where appropriate, to the IC piece by suitable connection technology. By having the power supplies connected directly to the functional blocks, rather than to terminal pads around the edge of the IC piece, the power bus widths are kept narrow and their lengths are shorter, with acceptable power bus thickness, so as to save space and minimize resistive current loss and electrical noise. Also, the common signal ground on the IC piece takes minimal current, and can be of minimum width.

Some circuits require high dielectric constant, low voltage capacitors, and resistors and small inductors. In the system 10 of the present invention, such capacitors, resistors and inductors can be incorporated in the dielectric body 14 of the substrate 12.

High dielectric constant capacitors embedded in a fired multilayer ceramic printed circuit board stack on a metal support are known. A screen printable low firing temperature capacitor ink is formed from lead-magnesium niobate and lead titanate powders, mixed together with a glass powder or a lead oxide powder, and a suitable organic vehicle. The capacitor layer is alternated with conductor layers, usually of silver, to form high dielectric constant capacitors.

Embedded resistors can also be made part of the present multilayer ceramic system. Thick film resistors can be made from ruthenium oxide and suitable glasses that sinter at low temperatures, mixed with an organic vehicle. The resistor ink can be screen printed onto a green tape stack on a metal support substrate and covered with one to two green tapes and terminated with an underlying first conductor layer. The green tapes are aligned, laminated and fired. A second conductor layer can be screen printed on top of the fired, supported green tape stack and post-fired.

Inductors are made by screen printing a thick film conductor ink made from silver, preferably a mixture of silver powder and silver flake, together with a glass and an organic vehicle over a green tape.

In the device of the present invention, the capacitors, resistors and inductors can be positioned wherever desired on the substrate. This allows the capacitors and inductors to be properly positioned so as to eliminate coupling ground/power noise. If desired, the capacitors can be provided on the power supply circuit chips 34, the signal processing piece 30, or they can be discrete components that are placed in the recesses 24 in the body 14, or on the top surface of the body 14. Furthermore, in the substrate 12, signal lines can be built in transmission-line, shielded configuration to prevent undesirable crosstalk.

The low voltage integrated circuit, such as the type that may be used in the IC device of the present invention, may have to interact with external integrated circuits or systems that operate at voltages higher than the operating voltage of the low voltage integrated circuit. In such case, voltage-translating interface circuitry is necessary so that signals can be transmitted from the chip operating at low voltage to any others operating at higher voltages. Since the power supply chips utilize technology that converts a high voltage DC input to a low voltage input, unused portions of the chips can also be utilized to construct the interface circuitry to provide signal voltage translation between the low voltage chip and the other chips in the signal path. In such case, a one volt signal will go from the substrate to the voltage translation circuitry on a power supply chip using the metallization on the substrate and then, after voltage translation, to an output pad on the substrate. A high voltage input signal will follow a reverse but similar path.

Although the device of the present invention has been shown and described as having the power supply chips and the interface circuits on separate chips mounted on a substrate, the power supply circuits and the interface circuit may be placed on a single silicon chip. In addition, the power supply circuitry, signal level translation interface circuitry and the signal processing circuitry may be fabricated on a single silicon substrate. Also, capacitors, resistors and inductors may be integrated into, or fabricated on the surface of, the single silicon chip. Furthermore, the power supply circuits may be formed of smart power supplies which go into "standby" when the function block is not being used.

What is claimed is:

1. An integrated circuit system comprising:
   a substrate of an insulating material having a surface;
   an IC semiconductor piece mounted on said substrate surface, said IC piece including an electrical circuit having a plurality of functional blocks; and
   a plurality of power supply chips mounted on said substrate, each of said power supply chips being electrically connected to a separate functional block of said IC piece and being capable of reducing the input voltage to a lower voltage required by the functional block of the circuit to which the power supply chip is connected.

2. The integrated circuit system of claim 1 in which the substrate includes a plurality of electrical conductors extending therethrough, said power supply chips and the IC piece being electrically connected to the conductors in the substrate to electrically connect the power supply chips to the functional blocks of the IC piece.

3. The integrated circuit system of claim 2 in which the substrate comprises a body made from multiple layers of insulating material, the conductors are deposited on each of the multiple layers and vias of a conductive material connect the conductors through the insulating layers to the surface of the body.

4. The integrated circuit system of claim 3 in which the IC semiconductor piece has a plurality of contacts on a surface thereof with the contacts being seated on and engaging the vias in the substrate at the surface of the substrate, or a conductor on the surface of the substrate.

5. The integrated circuit system of claim 4 in which the body of the substrate has a plurality of recesses in its top surface with conductors being exposed in each recess, the power supply chips are seated in the recesses and are electrically connected to the conductors so as to be electrically connected to the IC piece through the conductors and vias.

6. The integrated circuit system of claim 3 in which the body of the substrate contains regions of a magnetic material with conductors in or surrounding the magnetic material to form embedded inductors.

7. The integrated circuit system of claim 6 in which capacitors are embedded in the multiple insulating layers by screen printing a capacitor ink on an insulating layer and screen printing a conductor ink above and below the capacitor ink layer.

8. The integrated circuit system of claim 2 in which a housing surrounds and encloses the IC piece and the substrate, the housing having heat conducting capabilities to cool the IC piece.

9. The integrated circuit system of claim 8 in which the housing includes a heat dissipating plate on which the substrate is mounted, said heat dissipation plate being of thermally conductive material and having fins extending therefrom.

10. The integrated circuit system of claim 8 in which the housing further comprises a cover extending over the IC chip and having cooling means, and means to secure the cover to the substrate so as to enclose the IC piece between the cover and the substrate.

11. The integrated circuit system of claim 1 including capacitors on the substrate, IC piece and/or the power supply chip electrically connected to the various circuits thereon.

12. The integrated circuit system of claim 1 including inductors on the substrate, IC piece and/or the power supply chips and electrically connected to the various circuits thereon.

13. The integrated circuit system of claim 1 further including voltage feedback means connected between the circuit on the IC piece and the power supply chip.

14. An integrated circuit system of claim 1 wherein the plurality of power supply chips are formed as a single chip on a silicon substrate.

15. The integrated circuit system of claim 14 wherein the single silicon chip containing the multiple power supply chips further containing I/O circuits of the said integrated circuit system.

16. The integrated circuit system of claim 15 wherein the I/O circuits are also capable of voltage level translation between the IC piece operating at low voltage and the external circuitry operating at a higher voltage.

17. The integrated circuit system of claim 1 wherein sections of the power supply chips may be combined and formed in a common silicon chip and other sections are formed in separate chips.

18. The integrated circuit system of claim 2 wherein certain connections between the IC piece and the power supply chips may be made by direct connection without connecting through the substrate.

19. An integrated circuit system comprising:

an IC semiconductor piece containing an electrical circuit having a plurality of functional blocks; and a plurality of power supply circuit chips on said semiconductor piece, each of said power supply circuit chips connected to a separate functional block and being capable of reducing an input voltage to a lower voltage required by the functional block of the circuit to which the power supply circuit chip is connected.

* * * * *